(12) United States Patent
Lee et al.

(10) Patent No.: US 10,186,954 B1
(45) Date of Patent: Jan. 22, 2019

(54) VOLTAGE CONVERTING CIRCUIT AND CONTROL CIRCUIT THEREOF

(71) Applicant: Excelliance MOS Corporation, Hsinchu County (TW)

(72) Inventors: Ching-Tsan Lee, Hsinchu County (TW); Ke-Wei Wu, Hsinchu County (TW); Ming-Hung Chien, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 16/018,082

(22) Filed: Jun. 26, 2018

(30) Foreign Application Priority Data

Apr. 10, 2018 (TW) .............................. 107112333 A

(51) Int. Cl.
*H02M 1/36* (2007.01)
*G05F 1/625* (2006.01)
*G01R 19/165* (2006.01)
*H02M 1/00* (2006.01)

(52) U.S. Cl.
CPC ........ *H02M 1/36* (2013.01); *G01R 19/16576* (2013.01); *G05F 1/625* (2013.01); *H02M 2001/0006* (2013.01)

(58) Field of Classification Search
None
See application file for complete search history.

(56) References Cited

U.S. PATENT DOCUMENTS

| 5,239,216 | A | * | 8/1993 | Sei | ..................... | H03K 17/0422 |
| | | | | | | 327/314 |
| 6,882,513 | B2 | | 4/2005 | Laraia | | |
| 2013/0038301 | A1 | * | 2/2013 | Ouyang | ................ | H02M 3/156 |
| | | | | | | 323/271 |
| 2014/0070779 | A1 | * | 3/2014 | Takagi | ................ | H02M 3/1588 |
| | | | | | | 323/271 |
| 2016/0276931 | A1 | * | 9/2016 | Trichy | ................... | H02M 3/158 |
| 2018/0102636 | A1 | * | 4/2018 | Wan | ........................ | H02H 3/18 |

FOREIGN PATENT DOCUMENTS

| CN | 101997305 | 3/2011 |
| TW | I301936 | 10/2008 |
| TW | I449287 | 8/2014 |

* cited by examiner

*Primary Examiner* — Cassandra Cox
(74) *Attorney, Agent, or Firm* — JCIPRNET

(57) ABSTRACT

A voltage converter and a control circuit thereof are provided. The control circuit includes a voltage status comparator and a control signal generator. The voltage status comparator receives an input voltage and an output voltage, and provides a base voltage. The voltage status comparator compares voltage values of the output voltage and the input voltage or compares voltage values of the output voltage and the base voltage according to a voltage status of the input voltage, and generates a comparison result. The voltage status comparator generates a bias voltage according to the comparison result. The control signal generator generates a control signal according to the bias voltage and transmits the control signal to a control terminal of a driving switch, where the driving switch is turned on or cut off according to the control signal.

14 Claims, 4 Drawing Sheets

VOLTAGE CONVERTING CIRCUIT AND CONTROL CIRCUIT THEREOF

CROSS-REFERENCE TO RELATED APPLICATION

This application claims the priority benefits of Taiwan application serial no. 107112333, filed on Apr. 10, 2018. The entirety of the above-mentioned patent application is hereby incorporated by reference herein and made a part of this specification.

BACKGROUND OF THE INVENTION

Field of the Invention

The invention relates to a voltage converting circuit and a control circuit thereof, and particularly relates to a voltage converting circuit capable of quickly turning off a driving switch and a control circuit thereof.

Description of Related Art

In the conventional technical field, a power supply circuit provides a driving switch, and supplies an output voltage by turning on the driving switch. Moreover, in case that an input voltage is provided, when the output voltage has a situation of instantaneously exceeding the input voltage, the conventional power supply circuit may generate a control signal to cut off the driving switch, so as to activate a reverse voltage protection mechanism of the power supply circuit.

However, in order to avoid a miss operation, the power supply circuit of the conventional technique may perform a de-bouncing operation to the control signal. The de-bouncing operation is generally set to a range of 2-10 ms. When the output voltage has a phenomenon of instantaneous increase within the range of 2-10 ms, the power supply circuit of the conventional technique cannot opportunely cut off the driving switch, which probably causes damage to circuit elements.

On the other hand, when the input voltage is zero or presents a high impedance, when the output voltage has the phenomenon of instantaneous increase, the power supply circuit of the conventional technique cannot immediately cut off the driving switch, which may also cause damage to the circuit elements.

SUMMARY OF THE INVENTION

The invention is directed to a voltage converting circuit and a control circuit thereof, which may achieve a reverse voltage protection function.

The invention provides a control circuit adapted to control a driving switch. Two terminals of the driving switch respectively receive an input voltage and an output voltage. The control circuit includes a voltage status comparator and a control signal generator. The voltage status comparator receives the input voltage and the output voltage, and provides a base voltage. The voltage status comparator compares a voltage value of the output voltage and a voltage value of the input voltage or the base voltage according to a voltage status of the input voltage, and generates a comparison result. The voltage status comparator generates a bias voltage according to the comparison result. The control signal generator is coupled to the voltage status comparator. The control signal generator generates a control signal according to the bias voltage and transmits the control signal to a control terminal of the driving switch, where the driving switch is turned on or turned off according to the control signal.

In an embodiment of the invention, when the voltage value of the output voltage is greater than the voltage value of the input voltage, the voltage status comparator generates a first current, and generates the bias voltage according to the first current.

In an embodiment of the invention, when the input voltage has a high impedance status, the voltage status comparator compares the voltage value of the output voltage and the voltage value of the base voltage, and when the voltage value of the output voltage is greater than the voltage value of the base voltage, the voltage status comparator generates a first current, and generates the bias voltage according to the first current.

The invention provides a voltage converting circuit includes a driving switch and a control circuit. Two terminals of the driving switch respectively receive an input voltage and an output voltage. The control circuit includes a voltage status comparator and a control signal generator. The voltage status comparator receives the input voltage and the output voltage, and provides a base voltage. The voltage status comparator compares a voltage value of the output voltage and a voltage value of the input voltage or the base voltage according to a voltage status of the input voltage, and generates a comparison result. The voltage status comparator generates a bias voltage according to the comparison result. The control signal generator is coupled to the voltage status comparator. The control signal generator generates a control signal according to the bias voltage and transmits the control signal to a control terminal of the driving switch, where the driving switch is turned on or turned off according to the control signal.

According to the above description, the invention provides the control circuit to generate the control signal by detecting voltage statuses of the input voltage and the output voltage. When the input voltage is lower than the output voltage, or the input voltage does not exist, the control signal is produced to turn off the driving switch. In this way, in case of the reverse voltage phenomenon occurred on the driving switch, the driving switch may be turned off to effectively achieve an element protection effect, so as to ensure the safety of the voltage converting circuit.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
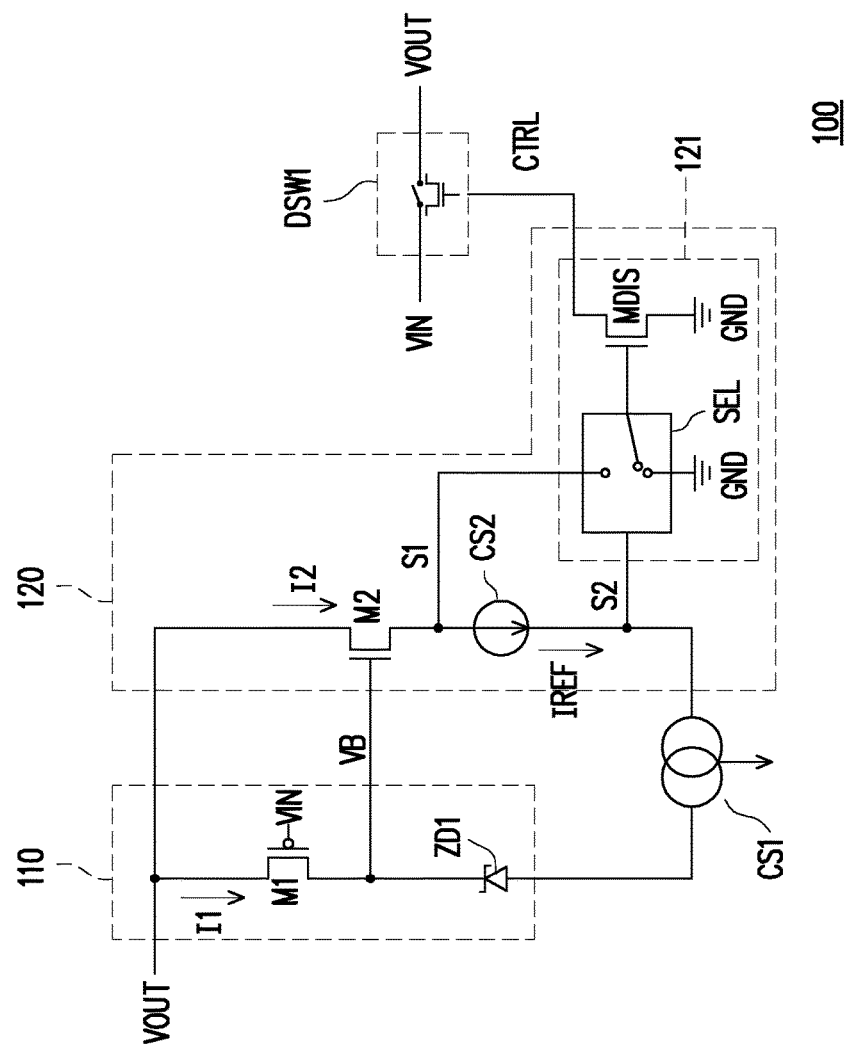
FIG. 1 is a schematic diagram of a control circuit according to an embodiment of the invention.

Referring to FIG. 1, FIG. 1 is a schematic diagram of a control circuit according to an embodiment of the invention. The control circuit 100 may be used for controlling a driving switch DSW1, where two terminals of the driving switch DSW1 respectively receive an input voltage VIN and an output voltage VOUT. The control circuit 100 includes a voltage status comparator 110 and a control signal generator 120. In the embodiment, the voltage status comparator 110 includes a transistor M1 and a diode ZD1. A first terminal of the transistor M1 receives the output voltage VOUT, a control terminal of the transistor M1 receives the input voltage VIN, and a second terminal of the transistor M1 is coupled to a cathode of the diode ZD1. Moreover, an anode of the diode ZD1 may be coupled to a current source CS1. The diode ZD1 may be a Zener diode.

Moreover, the control signal generator 120 includes a transistor M2, a current source CS2 and a pull-down circuit 121. A first terminal of the transistor M2 receives the output voltage VOUT, a control terminal of the transistor M2 receives a bias voltage VB, and a second terminal of the transistor M2 is coupled to the current source CS2. The current source CS2 is connected in series between the current source CS1 and the second terminal of the transistor M2, and draws a reference current IREF from the second terminal of the transistor M2.

In a first operation status of the control circuit 100, when the control terminal of the transistor M1 receives the effective input voltage VIN, the transistor M1 may compare the output voltage VOUT with a sum of the input voltage VIN and a threshold voltage Vth of the transistor M1 to generate a comparison result. The transistor M1 is turned on when the output voltage VOUT>the input voltage VIN+the threshold voltage Vth, and generates a current I1 according to the comparison result. The current I1 flows to the diode ZD1, and generate a bias voltage VB at the cathode of the diode ZD1.

According to the above description, the transistor M2 generates a current I2 according to the bias voltage VB produced by the voltage status comparator 110. Moreover, based on a difference of the current I2 and the reference current IREF, a signal S1 is produced on the second terminal of the transistor M2, and a signal S2 is produced on a coupling node of the current source CS2 and the current source CS1. The signals S1 and S2 are transmitted to the pull-down circuit 121. The pull-down circuit 121 may pull down a voltage level of a control signal CTRL according to the signals S1, S2, and the control signal CTRL of the low voltage level may turn off the driving switch DSW1 to activate a reverse voltage protection mechanism.

To be specific, in the embodiment, the pull-down circuit 121 includes a selector SEL and a transistor MDIS. The selector SEL receives the signals S1, S2 and is coupled to a reference voltage GND. A control terminal of the transistor MDIS is coupled to an output terminal of the selector SEL, and the transistor MDIS is controlled by an output voltage of the selector SEL.

It should be noted that when the output voltage VOUT is greater than the input voltage VIN, the voltage status comparator 110 may provide the bias voltage VB. The transistor M2 generates the current I2 according to the bias voltage VB. Moreover, when the current I2 is greater than the reference current IREF, a parasitic capacitor on the second terminal of the transistor M2 may be charged based on a difference between the current I2 and the reference current IREF. In this way, the signal S1 with a high voltage value may be produced on the second terminal of the transistor M2. Meanwhile, the selector SEL may select the signal S1 with the high voltage value to output according to the signal S2, such that the control terminal of the transistor MDIS receives the signal S1 with the high voltage value. In this way, the transistor MDIS is turned on, and the voltage level of the control signal CTRL is pulled down to the reference voltage GND (for example, a ground voltage).

It should be noted that when the current I2 is smaller than the reference current IREF, the signal S1 with a low voltage value may be produced on the second terminal of the transistor M2. In this case, the selector SEL selects to output the low voltage, and the transistor MDIS is maintained to a turn-on state.

On the other hand, in a second operation status of the control circuit 100, when the control terminal of the transistor M1 receives none input voltage VIN, and presents a high impedance status is presented, the transistor M1 may compare the output voltage VOUT with the base voltage provided by the diode ZD1, and generate the current I1 according to a comparison result. The base voltage may be equal to a breakdown voltage of the diode ZD1, and when the output voltage VOUT>the base voltage, the transistor M1 correspondingly generates the current I1, and generates the bias voltage VB according to the current I1.

In this way, the control signal generator 120 may pull down the voltage value of the control signal CTRL according to the bias voltage VB, so as to turn off the driving switch DSW1 to activate the reverse voltage protection mechanism.

Figure 2:
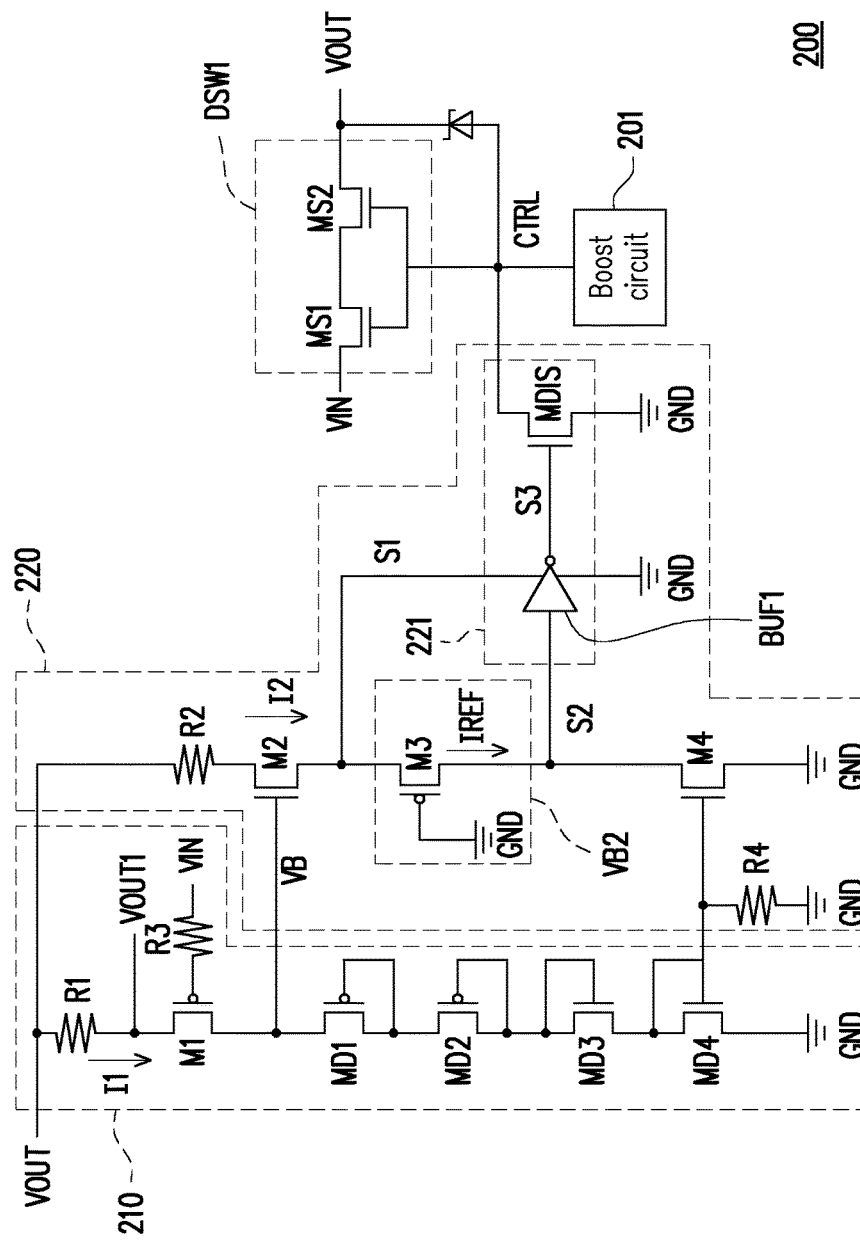
FIG. 2 is a schematic diagram of a control circuit according to another embodiment of the invention.

Referring to FIG. 2, FIG. 2 is a schematic diagram of a control circuit according to another embodiment of the invention. The control circuit 200 is used for turning on/off the driving switch DSW1, and is used for activating the reverse voltage protection mechanism. The control circuit 200 includes a voltage status comparator 210 and a control signal generator 220. The voltage status comparator 210 includes transistors M1, MD1-MD4 and resistors R1 and R3. A first terminal of the transistor M1 receives the output voltage VOUT through the resistor R1. A control terminal of the transistor M1 receives the input voltage VIN through the resistor R3, and a second terminal of the transistor M1 generates the bias voltage VB. The transistors MD1-MD4 are coupled in a diode configuration, and are sequentially connected in series between the second terminal of the transistor M1 and the reference voltage GND. The diodes composed of the transistors MD1-MD4 are sequentially and forwardly biased between the second terminal of the transistor M1 and the reference voltage GND, and a sum of conduction voltages of the transistors MD1-MD4 is provided to serve as the base voltage.

It should be noted that in the embodiment, the number of diodes configured between the transistor M1 and the reference voltage GND is not particularly specified. In FIG. 2, four transistors are illustrated to construct four diodes, though it is only an example and is not used for limiting the scope of the invention. Moreover, a conductive pattern of the transistors used for constructing the diodes may be arbitrary, and in FIG. 2, two P-type transistors MD1, MD2 and two N-type transistors MD3, MD4 are illustrated to construct the diodes, though it is only an example and is not used for limiting the scope of the invention.

The control signal generator 220 includes resistors R3, R4, transistors M2, M4, a current source CS2 and a pull-down circuit 221. A first terminal of the transistor M2 receives the output voltage VOUT through the resistor R2, a control terminal of the transistor M2 receives the bias voltage VB, and a second terminal of the transistor M2 is coupled to the current source CS2. The current source CS2 is composed of the transistor M3. A first terminal of the transistor M3 is coupled to the second terminal of the transistor M2, and generates a signal S1, a second terminal of the transistor M3 is coupled to a first terminal of the transistor M4, and generates a signal S2. A control terminal of the transistor M3 receives the reference voltage GND. The transistor M4 is coupled in series between the second terminal of the transistor M3 and the reference voltage GND, and a control terminal of the transistor M4 receives a reference bias VB2, where the reference bias VB2 is generated by the transistor MD4. Moreover, the resistor R4 is connected in series between the control terminal of the transistor M4 and the reference voltage GND.

Moreover, the pull-down circuit 221 includes a buffer BUF1 and a transistor MDIS. The buffer BUF1 receives the signal S1 to serve as an operation power. The buffer BUF1 receives the signal S2, and inverts the signal S2 to generate a signal S3 to control the transistor MDIS. When the transistor MDIS is turned on, the transistor MDIS pulls down the voltage value of the control signal CTRL, so as to turn off the driving switch DSW1 to activate the reverse voltage protection mechanism.

In view of a circuit operation, when the input voltage VIN exists, and when a difference between the output voltage VOUT and the input voltage VIN is greater than a threshold voltage of the transistor M1, the reverse voltage protection mechanism may be activated. Alternatively, when the input voltage VIN does not exist, and when the output voltage VOUT is greater than the base voltage, the reverse voltage protection mechanism may also be activated. When the reverse voltage protection mechanism is activated, a current I1 is generated on the transistor M1, wherein the current I1=(VOUT−VOUT1)/R1.

The current I1 flowing through the transistor M1 may produce the bias voltage VB on the second terminal of the transistor M1. Similarly, as the current I1 sequentially flows through the transistors MD1-MD4, the control terminals of each of the transistors MD1-MD4 may provide different biases, where the transistor MD4 may provide the reference bias VB2.

In the control signal generator 220, the transistor M2 receives the bias voltage VB, and generates the current I2. By comparing the current I2 and a reference current IREF generated by the transistor M3, the signal S1 may be generated on the second terminal of the transistor M2. When the transistor M2 receives the bias voltage VB that is large enough, the current I2 is greater than the reference current IREF, and the signal S1 has a higher voltage value.

The buffer BUF1 receives the signal S1 with the higher voltage value to serve as the operation power, and is enabled by the signal S1 with the higher voltage value. Moreover, the enabled buffer BUF1 inverts the signal S2 with a lower voltage value to generate the signal S3 with a high voltage level. Meanwhile, the control terminal of the transistor MDIS receives the signal S3 with the high voltage level, and is turned on by the signal S3. In this way, the transistor MDIS may pull down the voltage value of the control signal CTRL, so as to turn off the driving switch DSW1 to activate the reverse voltage protection mechanism.

Comparatively, when the transistor M2 receives the bias voltage VB with a low voltage value, the current I2 is smaller than the reference current IREF, and the signal S1 has a lower voltage value. In this case, the buffer BUF1 is disabled (does not operate), and the voltage value of the control signal CTRL is maintained to an original status, such that the driving switch DSW1 is continuously turned on.

It should be noted that in the embodiment, the control circuit 200 may further include a boost circuit 201. The boost circuit 201 is coupled to a terminal of the transistor MDIS used for providing the control signal CTRL. The boost circuit 201 is used for pulling up the voltage value of the control signal CTRL in a normal operation, so as to turn on the driving switch DSW1.

Moreover, in the embodiment, the driving switch DSW1 includes a plurality of transistors MS1, MS2 connected in series, where the transistor MS2 may be a transistor with a high voltage capacity, and the transistor MS1 may be a transistor with a low voltage capacity.

Figure 3A:
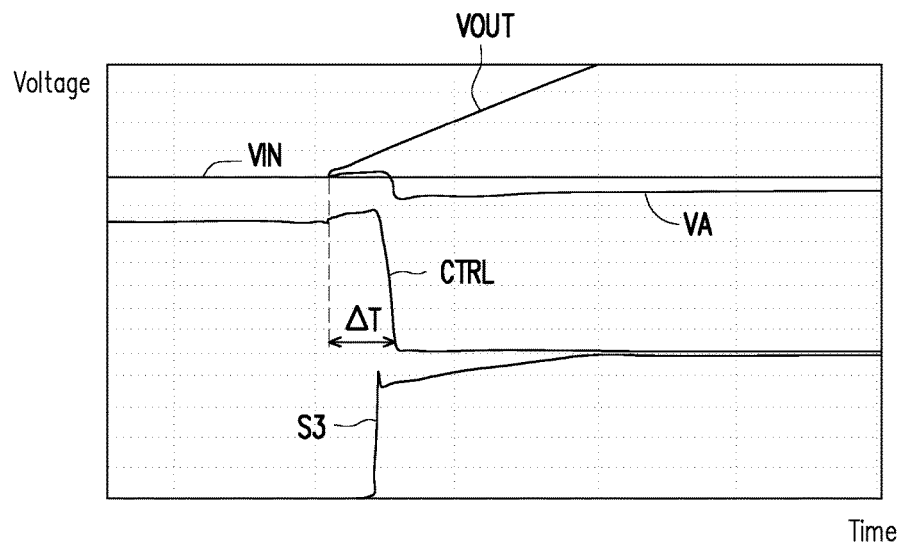
FIG. 3A and FIG. 3B are operation waveform diagrams of a control circuit according to an embodiment of the invention.
Figure 3B:
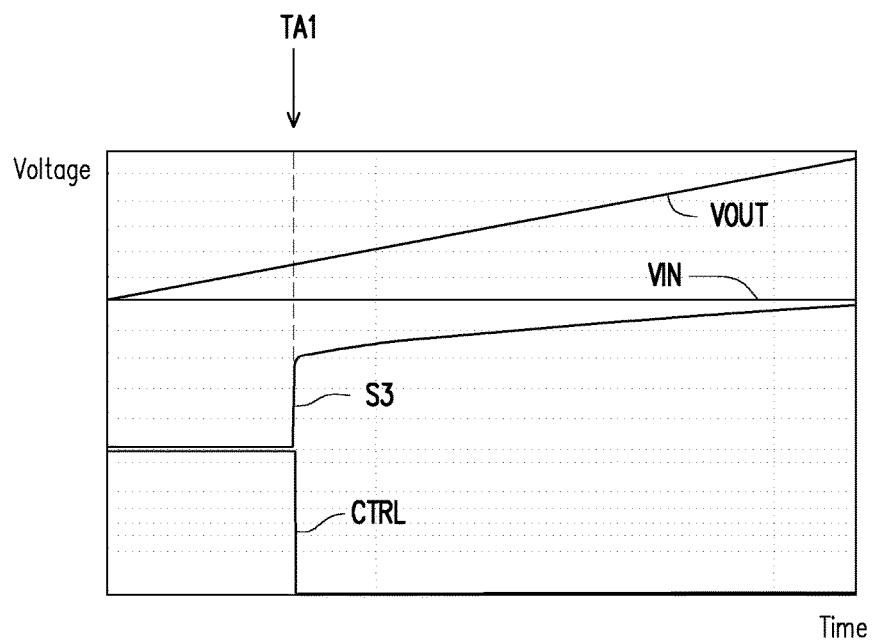

Referring to FIG. 2, FIG. 3A and FIG. 3B, FIG. 3A and FIG. 3B are operation waveform diagrams of the control circuit according to an embodiment of the invention. In FIG. 3A, when the input voltage VIN exists (which is, for example, equal to 5 volts), the output voltage VOUT is progressively increased from a low voltage level to a high voltage level. It is discovered that after the output voltage VOUT is greater than the input voltage VIN for a time interval ΔT, the buffer BUF1 may generate the signal S3 with the high voltage level, and quickly pull down the voltage level of the control signal CTRL, so as to turn off the driving switch DSW1. A time length of the time interval ΔT is about 2.44 μs, and a voltage VA is a voltage on a coupling node of the transistors MS1, MS2.

In FIG. 3B, the input voltage VIN does not exist, and the output voltage VOUT is progressively increased from the low voltage level to the high voltage level. It is discovered that at a time point TA1 when the output voltage VOUT starts to be greater than the base voltage (now the output voltage VOUT is about 7.91 volts), the buffer BUF1 may quickly generate the signal S3 with the high voltage level, and quickly pull down the voltage level of the control signal CTRL, so as to turn off the driving switch DSW1.

According to FIG. 3A and FIG. 3B, it is known that the control circuit of the embodiment of the invention may quickly and opportunely cut off the driving switch DSW1 in case that a reverse voltage state is occurred, so as to opportunely activate the reverse voltage protection mechanism.

Figure 4:
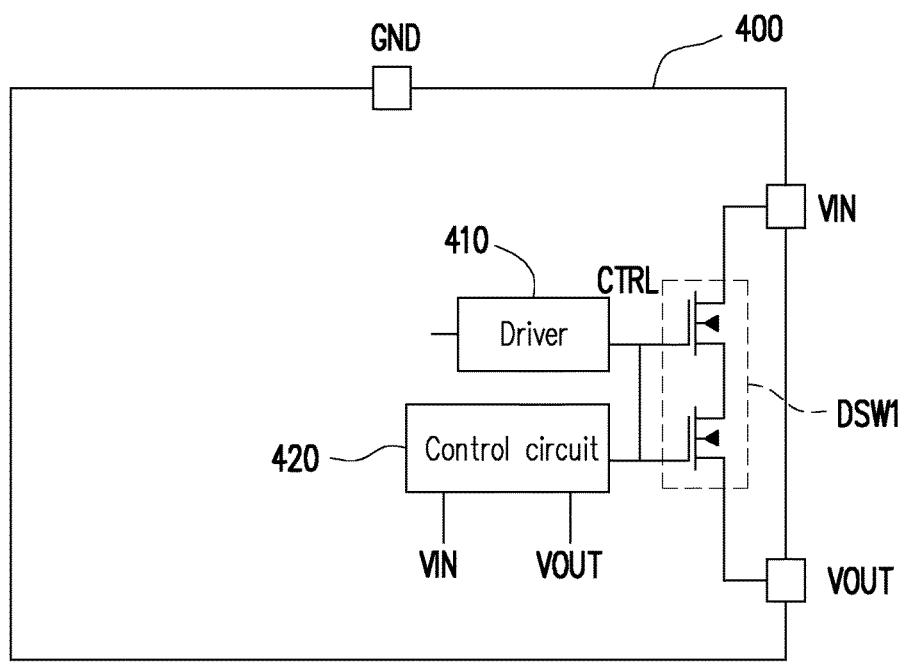
FIG. 4 is a schematic diagram of a voltage converting circuit according to an embodiment of the invention.

Referring to FIG. 4, FIG. 4 is a schematic diagram of a voltage converting circuit according to an embodiment of the invention. The voltage converting circuit 400 includes a driving switch DSW1, a driver 410 and a control circuit 420. The voltage converting circuit 400 has a plurality of pins to respectively receive the input voltage VIN, the output voltage VOUT and the reference voltage GND.

The driver 410 is used for generating the control signal CTRL to turn on/off the driving switch DSW1. The control circuit 420 is coupled to an output terminal of the driver 410. The control circuit 420 receives the input voltage VIN and the output voltage VOUT, and compares the output voltage VOUT with the input voltage VIN according to a voltage status of the input voltage VIN, or compares the output voltage VOUT with the reference voltage to obtain a comparison result, so as to determine whether to pull down the voltage value of the control signal CTRL, and cut off the driving switch DSW1 to activate the reverse voltage protection mechanism.

Implementation details of the control circuit 420 have been described in the aforementioned embodiments, and which are not repeated.

In summary, based on a voltage status of the input voltage, by comparing the output voltage and the input voltage or comparing the output voltage and the base voltage to obtain a comparison result, it is determined whether to pull down the voltage value of the control signal, so as to cut off the driving switch to activate the reverse voltage protection mechanism. In this way, under the premise of not influencing working stability of the voltage converting circuit, the reverse voltage protection mechanism may be effectively and quickly activated to improve safety and working performance of the voltage converting circuit.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A control circuit, adapted to control a driving switch, wherein two terminals of the driving switch respectively receive an input voltage and an output voltage, the control circuit comprising:
   a voltage status comparator, receiving the input voltage and the output voltage, providing a base voltage, comparing a voltage value of the output voltage and a voltage value of the input voltage or the base voltage according to a voltage status of the input voltage to generate a comparison result, and generating a bias voltage according to the comparison result; and
   a control signal generator, coupled to the voltage status comparator, generating a control signal according to the bias voltage, and transmitting the control signal to a control terminal of the driving switch,
   wherein the driving switch is turned on or turned off according to the control signal.

2. The control circuit as claimed in claim 1, wherein when the voltage value of the output voltage is greater than the voltage value of the input voltage, the voltage status comparator generates a first current, and generates the bias voltage according to the first current.

3. The control circuit as claimed in claim 1, wherein when the input voltage has a high impedance status, the voltage status comparator compares the voltage value of the output voltage and the voltage value of the base voltage, and when the voltage value of the output voltage is greater than the voltage value of the base voltage, the voltage status comparator generates a first current, and generates the bias voltage according to the first current.

4. The control circuit as claimed in claim 1, wherein the voltage status comparator comprises:
   a first transistor, having a first terminal receiving the output voltage, a control terminal receiving the input voltage, and a second terminal generating the first current; and
   at least one diode, coupled in series between the second terminal of the first transistor and a reference voltage, and configured to receive the first current to generate the bias voltage,
   wherein the at least one diode provides the base voltage.

5. The control circuit as claimed in claim 4, wherein the at least one diode is a Zener diode, an anode of the Zener diode receives the reference voltage, a cathode of the Zener diode is coupled to the second terminal of the first transistor, and a breakdown voltage of the Zener diode is equal to the base voltage.

6. The control circuit as claimed in claim 4, wherein the at least one diode comprises at least one second transistor, the at least one second transistor is coupled in a diode configuration, an anode of the at least one diode is coupled to the second terminal of the first transistor, and a cathode of the at least one diode is coupled to the reference voltage.

7. The control circuit as claimed in claim 4, wherein the voltage status comparator further comprises:
   a first resistor, coupled between the first terminal of the first transistor and the output voltage; and
   a second resistor, coupled between the control terminal of the first transistor and the input voltage.

8. The control circuit as claimed in claim 1, wherein the control signal generator comprises:
   a first transistor, having a first terminal receiving the output voltage, a control terminal receiving the bias voltage, and a second terminal generating a first signal;
   a current source, coupled to the second terminal of the first transistor, and drawing a reference current from the first transistor;
   a second transistor, having a first terminal coupled to the current source and generating a second signal, a second terminal coupled to a reference voltage, and a control terminal receiving a reference bias; and
   a pull-down circuit, receiving the first signal and the second signal, and generating the control signal, wherein the pull-down circuit pulls down a voltage level of the control signal according to the first signal and the second signal.

9. The control circuit as claimed in claim 8, wherein the current source comprises:
   a third transistor, coupled between the second terminal of the first transistor and the first terminal of the second transistor, and a control terminal of the third transistor receiving the reference voltage.

10. The control circuit as claimed in claim 8, wherein the pull-down circuit comprises:
    a selector, receiving the first signal and the second signal, and selecting the first signal or the reference voltage to generate a third signal according to the second signal; and
    a third transistor, having a first terminal generating the control signal, a second terminal receiving the reference voltage, and a control terminal receiving the third signal.

11. The control circuit as claimed in claim 8, wherein the pull-down circuit comprises:
    a buffer, receiving the first signal and the second signal, enabled according to the first signal, and inverting the second signal to generate a third signal; and
    a third transistor, having a first terminal generating the control signal, a second terminal receiving the reference voltage, and a control terminal receiving the third signal.

12. The control circuit as claimed in claim 8, wherein the control signal generator further comprises:
    a first resistor, coupled between the output voltage and the first terminal of the first transistor; and
    a second resistor, coupled between the control terminal of the second transistor and the reference voltage.

13. The control circuit as claimed in claim 1, further comprising:
    a boost circuit, coupled to the control terminal of the driving switch, and configured to increase a voltage value of the control signal.

14. A voltage converting circuit, comprising:
    a driving switch; and the control circuit as claimed in claim 1, wherein the control circuit is coupled to the driving switch, and provides the control signal to turn on or turn off the driving switch.

\* \* \* \* \*